(12) United States Patent
Dai et al.

(10) Patent No.: US 12,713,664 B2
(45) Date of Patent: Aug. 18, 2026

(54) SUPERJUNCTION DEVICE AND FABRICATION METHOD THEREFOR

(71) Applicant: SEMICONDUCTOR MANUFACTURING ELECTRONICS (SHAOXING) CORPORATION, Shaoxing (CN)

(72) Inventors: Yin Dai, Shaoxing (CN); Wenzhen Ren, Shaoxing (CN)

(73) Assignee: SEMICONDUCTOR MANUFACTURING ELECTRONICS (SHAOXING) CORPORATION, Zhejiang (CN)

( * ) Notice: Subject to any disclaimer, the term of this patent is extended or adjusted under 35 U.S.C. 154(b) by 782 days.

(21) Appl. No.: 17/773,245

(22) PCT Filed: Oct. 9, 2021

(86) PCT No.: PCT/CN2021/122725
§ 371 (c)(1),
(2) Date: Apr. 29, 2022

(87) PCT Pub. No.: WO2022/078248
PCT Pub. Date: Apr. 21, 2022

(65) Prior Publication Data

US 2022/0367616 A1 Nov. 17, 2022

(30) Foreign Application Priority Data

Oct. 12, 2020 (CN) ........................ 202011081612.X

(51) Int. Cl.
*H10D 62/10* (2025.01)
*H10D 30/01* (2025.01)
(Continued)

(52) U.S. Cl.
CPC ....... *H10D 62/111* (2025.01); *H10D 30/0297* (2025.01); *H10D 30/668* (2025.01); *H10D 62/393* (2025.01)

(58) Field of Classification Search
None
See application file for complete search history.

(56) References Cited

U.S. PATENT DOCUMENTS 9,437,727 B2 9/2016 Onishi
2003/0232477 A1 12/2003 Deboy et al.
(Continued)

FOREIGN PATENT DOCUMENTS

JP 2015220367 A 12/2015
JP 2016139761 A 8/2016
WO WO02067333 A1 8/2002

*Primary Examiner* — Yara B Green
*Assistant Examiner* — Fakeha Sehar
(74) *Attorney, Agent, or Firm* — MUNCY, GEISSLER, OLDS & LOWE, P.C.

(57) ABSTRACT

A super-junction device and a method of fabricating such a device are disclosed, in which a pillar of a second conductivity type situated at an interface between a transition region and a core region is narrowed in width across at least an upper thickness thereof, thereby reducing peak electric field strength in the transition region, increasing voltage endurance of the transition region and preventing the occurrence of avalanche breakdown first in the transition region. Additionally, a dopant ion concentration profile increasing in the direction from the transition region to the core region is created across upper portions of some pillars of the second conductivity type in the core region, which increases the presence of the dopant of the second conductivity type around the surface of the core region and thus stops a vertical electric field before it can reach wells of the second conductivity type. That is, an effective epitaxial thickness of the core region is reduced, which results in lower voltage
(Continued)

endurance thereof. In this way, it is ensured that avalanche breakdown occurs first in the core region, resulting in improved EAS performance.

5 Claims, 7 Drawing Sheets

(51) Int. Cl.
*H10D 30/66* (2025.01)
*H10D 62/17* (2025.01)

(56) References Cited

U.S. PATENT DOCUMENTS

2007/0272977 A1 11/2007 Saito et al.
2007/0272979 A1* 11/2007 Saito .................... H10D 30/665 257/E29.328
2008/0246085 A1* 10/2008 Saito .................... H10D 30/665 257/E29.066
2010/0230750 A1* 9/2010 Saito .................. H10D 30/0291 257/341
2011/0241110 A1* 10/2011 Xiao .................... H10D 62/111 257/E21.409
2012/0273884 A1* 11/2012 Yedinak ............... H10D 30/668 257/341
2014/0159152 A1 6/2014 Kim
2016/0035879 A1 2/2016 Ono et al.
2021/0296437 A1* 9/2021 Lee .................... H10D 30/0291
2023/0361168 A1* 11/2023 Han ..................... H10D 62/393

* cited by examiner

SUPERJUNCTION DEVICE AND FABRICATION METHOD THEREFOR

TECHNICAL FIELD

The present invention relates to the field of semiconductor devices, and more particularly to a super-junction device and a method of fabricating the device.

BACKGROUND

In the state of the art, there has been proposed a so-called CoolMOS super-junction device structurally based on vertical double-diffused metal-oxide-semiconductor field effect transistor (VDMOS) devices, which exhibits an effectively increased breakdown voltage resulting from super-junction structures in both its core region and termination region surrounding the core region. Each of the super-junctions consists essentially of a layer with high voltage endurance made up of alternately arranged p-type pillars and n-type pillars and n+ and p+ regions vertically sandwiching the layer. Energy during avalanche for single pulse (EAS), a parameter specifying the maximum energy that can be dissipated by a device in a turned-off state during a single pulse avalanche operation, is a critical metric for assessing the performance of a CoolMOS device, in particular one that may be with a high overshoot voltage present between its drain and source. In general cases, the occurrence of an avalanche can be prevented by a connected external snubber, or a high pulse current (dv/dt) can be prevented by additionally integrating a large resistance (Rg). However, these approaches will lead to increased cost or greater losses during use.

SUMMARY OF THE INVENTION

It is an objective of the present invention to provide a super-junction device, which allows avalanche breakdown to occur first in its core region and is thus improved in terms of energy during avalanche for single pulse (EAS) performance, as well as a method of fabricating such a device.

To this end, the present invention provides a super-junction device including an epitaxial layer of a first conductivity type, the epitaxial layer defining a core region, a termination region surrounding the core region and a transition region interposed between the core region and the termination region, the epitaxial layer containing a number of pillars of the first conductivity type and a number of pillars of a second conductivity type in the core and transition regions, which are arranged alternately, wherein upper portions of some of the pillars of the second conductivity type in the core region in proximity to the transition region exhibit a dopant ion concentration profile increasing in the direction from the transition region to the core region, and wherein a width of at least partial thickness of a pillar of the second conductivity type positioned at an interface between the transition region and the core region is less than a width of the pillar of the second conductivity type in the core region.

Optionally, the dopant ion concentrations of the upper portions of the pillars of the second conductivity type in the core region may be all higher than both a dopant ion concentration of any portion of the remainders of the pillars of the second conductivity type in the core region and a dopant ion concentration of any portion of the pillar of the second conductivity type at the interface between the transition region and the core region.

Optionally, the epitaxial layer of the first conductivity type may be a stack of multiple epitaxial layers, wherein a portion of the pillar of the second conductivity type at the interface between the transition region and the core region provided by the topmost two of the multiple epitaxial layers is narrower in width than the pillars of the second conductivity type in the core region.

Optionally, the width of the portion of the pillar of the second conductivity type at the interface between the transition region and the core region provided by the topmost two of the multiple epitaxial layers may be 7-14% less than the width of the pillar of the second conductivity type in the core region.

Optionally, the width of the pillar of the second conductivity type at the interface between the transition region and the core region may be overall 3-5% less than the width of the pillar of the second conductivity type in the core region.

Optionally, the pillars of the second conductivity type in the core region may be numbered from 1 to n in the direction from the transition region to the core region, in which the upper portions of the pillars of the second conductivity type numbered from 1 to i exhibit the increasing dopant ion concentration profile, and the dopant ion concentrations of the upper portions of the pillars of the second conductivity type numbered from i to n are equal, where n is a natural number greater than 1 and $1<i<n$.

Optionally, the super-junction device may further include:
- wells of the second conductivity type residing on top of the pillars of the second conductivity type in the core and transition regions;
- gates provided on the epitaxial layer of the first conductivity type in the core region;
- source regions provided in the wells of the second conductivity type on opposing sides of the gates; and
- a drain region formed on a backside of the epitaxial layer of the first conductivity type.

Optionally, the super-junction device may further include:
- a number of pillars of the first conductivity type and a number of pillars of the second conductivity type, which are arranged alternately in the epitaxial layer of the first conductivity type in the termination region; and
- a main junction residing on top of at least one of the pillars of the second conductivity type in the termination region in proximity to the transition region.

The present invention also provides a method of fabricating a super-junction device, including:
- providing a substrate defining a core region, a transition region and a termination region; and
- forming the epitaxial layer of the first conductivity type on the substrate and a number of pillars of the first conductivity type and a number of pillars of the second conductivity type in the epitaxial layer of the first conductivity type at least in the core and transition regions, which are arranged alternately, wherein upper portions of some of the pillars of the second conductivity type in the core region in proximity to the transition region exhibit a dopant ion concentration profile increasing in the direction from the transition region to the core region, and wherein the width of at least partial thickness of the pillar of the second conductivity type situated at an interface between the transition region and the core region is less than the width of the pillar of the second conductivity type in the core region.

Optionally, the dopant ion concentrations of the upper portions of the pillars of the second conductivity type in the core region may be all higher than both a dopant ion concentration of any portion of the remainders of the pillars of the second conductivity type in the core region and a dopant ion concentration of any portion of the pillar of the second conductivity type at the interface between the transition region and the core region.

Optionally, the formation of the epitaxial layer of the first conductivity type containing the alternately arranged pillars of the first and second conductivity types on the substrate may include:

a) growing a lower epitaxial layer of the first conductivity type on the substrate;

b) performing a first ion implantation to implant ions of the second conductivity type to regions of the lower epitaxial layer;

c) repeating steps a) to b) for a required number of times, wherein during the repetitions, the sizes of openings through which the first ion implantation processes are carried out are adjusted as required by a width variation of the pillar of the second conductivity type to be formed at the interface between the transition region and the core region and by a dopant ion concentration variation of the upper portions of the pillars of the second conductivity type in the core region; and d) performing an annealing process so that diffusion regions that have performed the first ion implantation processes diffuse are in contact in vertically adjacent two of the lower epitaxial layers, resulting in the formation of the alternately arranged pillars of the second and first conductivity types.

Alternatively, the formation of the epitaxial layer of the first conductivity type containing the alternately arranged pillars of the first and second conductivity types on the substrate may include:

a) growing a lower epitaxial layer of the first conductivity type on the substrate;

b) etching through a partial thickness of the lower epitaxial layer to form therein a number of deep trenches, a width of one of the deep trenches at the interface between the transition region and the core region is less than a width of each deep trench in the core region;

c) forming the alternately arranged pillars of the second and first conductivity types in the lower epitaxial layer by filling an epitaxial layer of the second conductivity type in the deep trenches; and d) as required by a desired dopant ion concentration profile of the upper portions of the pillars of the second conductivity type in the core region, implanting ions of the second conductivity type into the upper portions, thereby creating the dopant ion concentration profile increasing in the direction from the transition region to the core region across the upper portions.

Optionally, the method may further include forming wells of the second conductivity type on top of the respective pillars of the second conductivity type in the core and transition regions.

Optionally, the method may further include:

forming a number of pillars of the first conductivity type and a number of pillars of the second conductivity type in the termination region, which are alternately arranged, during the formation of the alternately arranged pillars of the first and second conductivity types in the epitaxial layer of the first conductivity type in the core and transition regions; and following the formation of the alternately arranged pillars of the first and second conductivity types in the termination region, forming a main junction in the termination region, which resides on top of at least one of the pillars of the second conductivity type in the termination region in proximity to the transition region.

The present invention has at least one of the following advantages over the prior art:

1. The pillar of the second conductivity type (e.g., a p-type pillar) situated at the interface between the transition region and the core region, which is narrower in width across at least an upper thickness thereof, can result in reduced peak electric field strength in the transition region and thus increased voltage endurance thereof. The dopant ion concentration profile increasing in the direction from the transition region to the core region across the upper portions of some pillars of the second conductivity type in the core region, i.e., increasing presence of the dopant of the second conductivity type around the surface of the core region with distance from the transition region to a maximum level, results in a peak electric field strength profile decreasing from the transition region toward the core region and reaching the minimum strength within the core region. As a result, a vertical electric field will stop before it can reach the wells of the second conductivity type (e.g., p-body regions). This results in reduced voltage endurance of the core region and allows avalanche breakdown to occur first in this region, thus resulting in improved EAS performance.

2. Further, locally narrowing the pillar of the second conductivity type (e.g., a p-type pillar) at the interface between the transition region and the core region across an upper thickness thereof can facilitate increasing the probability of avalanche breakdown occurring in a lower portion of one of the pillars of the second conductivity type in the core region or thereunder, thus additionally improving the device' EAS performance.

DETAILED DESCRIPTION

Figure 1:
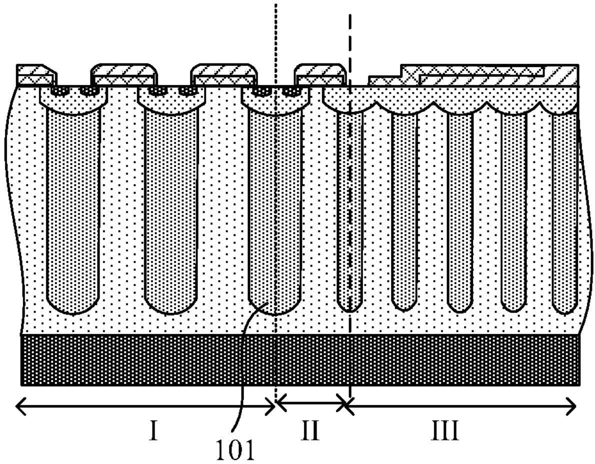
FIG. 1 is a schematic cross-sectional view illustrating the structure of an existing super-junction device.
Figure 2:
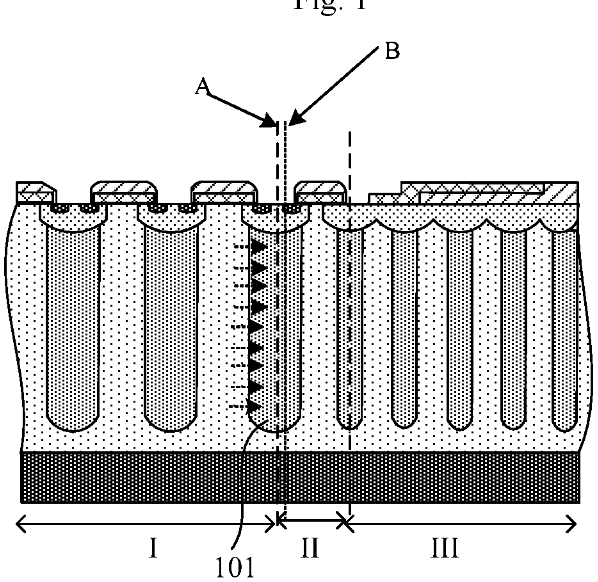
FIG. 2 schematically illustrates how avalanche breakdown occurs in the transition region of the super-junction device of FIG. 1.

Referring to FIGS. 1 and 2, we have found in our research that, for the existing super-junction device, avalanche breakdown tends to occur first in its transition region II for the following reason. A pillar 101 of a second conductivity type situated at an interface between the transition region II and the core region I can be considered indeed as being located partially in the core region I and partially in the transition region II. The part of the pillar 101 in the core region I is doubled in terms of pitch, dopant concentration and width compared to the part in the transition region II. An electric field in the super-junction device can be seen as a horizontal electric field coupled with a vertical electric field. Ideally, the strength of the horizontal electric field is expected to become zero at the location indicated by the dashed line A and to be twice as high in the part of the pillar 101 in the core region I (hereinafter referred to briefly as a "left part") as in the part in the transition region II (hereinafter referred to briefly as a "right part"). However, in fact, the actual ratio of the strength of the horizontal electric field in the right part of the pillar 101 to that in the left part is greater than 0.5, and the actual location where the strength of the horizontal electric field becomes zero is as indicated by the dashed line B. That is, more charge than expected is attracted to the right part of the pillar 101, leading to unbalanced charge depletion from the left part of the pillar 101. And excessive charge will be depleted to the right part in the core region I, thus avalanche breakdown tends to first occur in the transition region II during a single pulse avalanche operation (EAS).

In view of this, a core concept of the present invention is that, on one hand, the unbalanced electric field distribution in the transition region is improved, and thus voltage endurance to the transition region is increased; on the other hand, a voltage endurance profile in the core region decreasing in the direction from the transition region to the core region is created to shift the avalanche breakdown location into the core region as much as possible, thereby overcoming the problem that avalanche breakdown tends to first occur in the transition region during a single pulse avalanche operation (EAS).

The present invention will be described in greater detail below by way of particular embodiments with reference to FIGS. 3 to 17. Advantages and features of the present invention will become more apparent from the following description. Note that the figures are presented in a very simplified form not necessarily drawn to exact scale and provided merely to facilitate easy and clear description of those embodiments.

Figure 3:
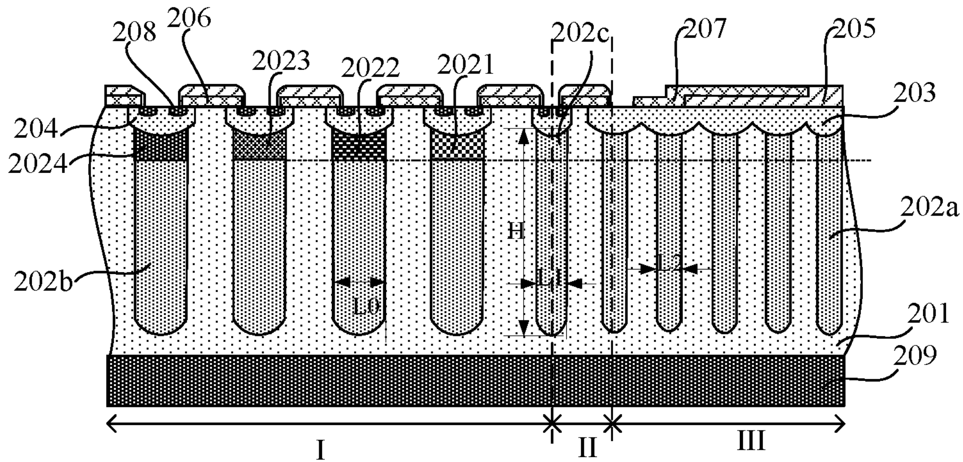
FIG. 3 is a schematic cross-sectional view illustrating the structure of a super-junction device according to an embodiment of the present invention.

Referring to FIG. 3, a super-junction device according to an embodiment of the present invention includes an epitaxial layer 201 of a first conductivity type, the epitaxial layer 201 defines a core region I, a termination region III surrounding the core region I and a transition region II interposed between the core region I and the termination region III. In the present embodiment, throughout the epitaxial layer 201 from the core region I to the termination region III, a number of pillars of the first conductivity type and a number of pillars of a second conductivity type are arranged alternately.

The epitaxial layer 201 may be a semiconductor layer doped with n-type ions or p-type ions and formed on a substrate (not shown) well-known to those skilled in the art, such as a silicon substrate, a silicon-on-insulator (SOI) substrate or a silicon germanium (SiGe) substrate. The epitaxial layer 201 may be a stack of multiple epitaxial layers. The pillars of the second conductivity type may be provided by the epitaxial layer 201 between adjacent pillars of the first conductivity type. In the present embodiment, the epitaxial layer 201 is n-type monocrystalline silicon.

Additionally, gates 206 are provided on the epitaxial layer 201 in the core region I and the transition region II, such that pillars 202*b* and 202*c* of the second conductivity type are located on both sides of the individual gates 206. Wells 204 of the second conductivity type reside on top of the pillars 202*b* and 202*c*, and source regions 208 are provided in the wells 204.

Additionally, a main junction 203 of the second conductivity type is provided in the termination region III such as to reside on top of both some pillars 202*a* in close proximity to the transition region II and pillars of the first conductivity type between these pillars 202*a*. Further, in the termination region III, a local field oxide 205 and a polysilicon gate 207 are formed on the epitaxial layer 201 in such a manner that the local field oxide 205 extends over and covers part of a surface of the main junction 203, with the polysilicon gate 207 covering both the local field oxide 205 and the rest of the surface of the main junction 203 that is not covered by the local field oxide 205.

Additionally, a drain region 209 is formed on a backside of the epitaxial layer 201 facing away from the gates 206.

The gates 206, pillars 202*b* of the second conductivity type, pillars of the first conductivity type, wells 204 of the second conductivity type, source regions 208, drain region 209 and other components, if any, in the core region I are core components, while the polysilicon gate 207, main junction 203, drain region 209 and other components, if any, in the termination region III constitute peripheral circuitry such as an input/output circuit. The core components in the core region I may be provided in structural forms depending on need. Optionally, the pillars 202*b* in the core region I may be present at a density that differs from that of the pillars 202*a* in the termination region III. When viewed from the top, the pillars 202*b* in the core region I may be shaped either identically to the pillars 202*a* in the termination region III, or not. For example, the pillars of the first conductivity type and pillars 202*b* of the second conductivity type in the core region I may be parallel elongate bars, whilst the pillars of the first conductivity type and pillars 202*a* of the second conductivity type in the termination region III may be rings surrounding the core region I.

In the present embodiment, the epitaxial layer 201 is an n-type epitaxial layer, the pillars of the first conductivity type are n-type pillars, the pillars of the second conductivity type are p-type pillars, the source regions 208 and the drain region 209 are both n-doped regions, and the wells 204 of the second conductivity type are p-type body regions.

Further, as shown in FIG. 3, upper portions of some of the pillars 202*b* of the second conductivity type in the core region I in close proximity to the transition region II exhibit a dopant ion concentration profile increasing in the direction from the transition region II to the core region I.

As an example, referring to FIG. 3, it is assumed that the pillars 202*b* of the second conductivity type in the core region I are numbered from 202*l* through 202*n* in the direction from the transition region II to the core region I and that upper portions of the pillars 202*b* of the second conductivity type numbered from 202*l* to 202*i* show an increasing concentration profile of p-type dopant ions while upper portions of the pillars 202*b* of the second conductivity type numbered from 202*i* to 202*n* contains ions of the dopant at the same concentration, where n is a natural number greater than 4 and i=4. It is also assumed that the ion concentrations of the p-type dopant in the upper portions of the pillars 202*b* of the second conductivity type in the core region I numbered from 202*l* to 202*n* are all higher than both an ion concentration of the p-type dopant in any portion of the remainders of these pillars 202*b* of the second conductivity type and an ion concentration of the p-type dopant in any portion of the pillar 202*c* of the second conductivity type in the transition region II.

In other embodiments of the present invention, i may be 2, or 3, or ≥5. The value of i determines the distance from an avalanche breakdown location in the core region I to a boundary of the transition region I, and may be determined as required in the design of the device.

Optionally, if it is assumed that the highest dopant concentration of the upper portions of the pillars 202*b* of the second conductivity type in the core region I is X and that the dopant ion concentration of the upper portion of the pillars 202*b* of the second conductivity type in the nearest neighborhood to an interface between the core region I and the transition region II is Y, and if we define the difference between these two values as Z=X−Y, then optionally, the ion concentration profile of the p-type dopant in the upper portions of the pillars 202*b* of the second conductivity type numbered from 202*l* to 202*i* that increases in the direction from the transition region II to the core region I may range from 25%*Z to 50%*Z.

In the present embodiment, the above-discussed dopant ion concentration profile across the upper portions of the pillars 202*b* of the second conductivity type in the core region I can offer at least the following benefits: 1) it results in an improved horizontal electric field distribution around the interface between the core region I and the transition region II, which reduces charge depletion from the core region I to the transition region II; 2) it increases the presence of the p-type dopant around the surfaces of the pillars 202*b* of the second conductivity type in the core region I, thus stopping a vertical electric field before it can reach the wells 204 of the second conductivity type, reducing an effective epitaxial thickness of the core region I and lowering its voltage endurance; and 3) it creates a voltage endurance profile of the pillars 202*b* of the second conductivity type decreasing in the direction from the transition region II to the core region I and thus shifts the avalanche breakdown location into the core region I that exhibits lower voltage endurance.

Further, in the present embodiment, a pillar 202*c* located at the interface between the transition region II and the core region I has an overall width L 1 smaller than a width L0 of each pillar 202*b* in the core region I. That is, if an overall height of the pillar 202*c* is indicated as H, then its width is reduced across the entire height H. As a result, the pillars of the second conductivity type have a varying width profile from the core region I to the termination region III. This results in reduced peak horizontal electric field strength in the transition region II and hence increased voltage endurance of the transition region II, thus avoiding the occurrence of avalanche breakdown first in the transition region II. In other words, the arrangement of the pillars 202*b* in the core region I is taken into account to ensure that avalanche breakdown occurs first in the core region I, thereby resulting in improved EAS performance of the device.

Test results show that a decrease of 3-5% in the overall width L1 of the pillar 202*c* relative to the width of the pillars 202*b* in the core region I, which lies within a permissible fabrication process variation range for the pillars of the second conductivity type in the super-junction device, can well control the location where avalanche breakdown first occurs within the core region I and thus achieve optimum performance of the device while not adversely affecting the electric field in the transition region.

It is to be noted that the overall width L1 of the pillar 202*c* at the interface between the transition region II and the core region I may exceed a width L2 of each pillar 202*a* in the termination region III.

Also note that, although it has been described in the above embodiment that the overall width of the pillar 202*c* is reduced as an example, the present invention is not so limited, as in other embodiments thereof, it is also possible that the pillar 202*c* at the interface between the transition region II and the core region I is reduced in width only across an upper thickness with the upper portions of the pillars 202*b* in the core region I exhibiting a dopant ion concentration profile increasing in the direction from the transition region II to the core region I. Such embodiments can achieve similar effects as the above embodiment.

Figure 4:
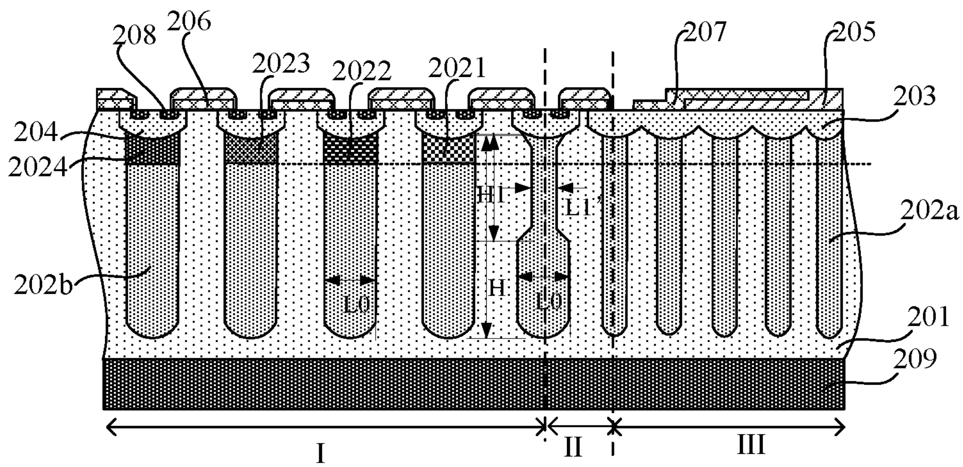
FIG. 4 is a schematic cross-sectional view illustrating the structure of a super-junction device according to another embodiment of the present invention.

For example, referring to FIG. 4, in a super-junction device according to another embodiment of the present invention, an upper portion of the pillar 202*c* at the interface between the transition region II and the core region I (extending from the top of the pillar 202*c* to a depth H1) has a reduced width L1', while the remainder of the pillar 202*c* has a width equal to the width L0 of the pillars 202*b* in the core region I. This design can reduce peak electric field strength around the surface of the transition region II, thus preventing breakdown of the transition region II around the surface and increasing voltage endurance of the transition region II. Thus, it is avoided that avalanche breakdown first occurs in the transition region II. In this embodiment, the upper portions of the pillars 202*b* in the core region I exhibit a dopant ion concentration profile increasing in the direction from the transition region II to the core region I, thereby stopping a vertical electric field before it can reach the wells 204 of the second conductivity type (p-type body regions). Additionally, this also reduces voltage endurance of the core region I, ensuring that avalanche breakdown occurs first in the core region I and resulting in improved EAS performance.

Test results show that, in this case, a decrease of 7-14% from L0 to L1', which lies within a permissible fabrication process variation range for the pillars of the second conductivity type in the super-junction device, can well control the location where avalanche breakdown first occurs within the core region I, prevent breakdown of the transition region around the surface and thus achieve optimum performance of the device while not adversely affecting the electric field in the transition region.

In the embodiment shown in FIG. 4, in case the epitaxial layer 201 is a stack of multiple epitaxial layers, as an example, a portion of the pillar 202*c* provided by at least the two topmost layers (not shown) of the epitaxial layer 201 may be 7-14% reduced in width relative to the pillars 202*b* in the core region I.

In comparison with the above embodiment with a reduced overall width of the pillar of the second conductivity type positioned at the interface between the transition region II and the core region I, according to this embodiment, this pillar is reduced in width only across an upper thickness. This can not only make it easier to achieve the pillar's width variation but can also increase the probability that avalanche breakdown occurs first in a lower portion of one pillar of the second conductivity type in the core region I during a single pulse avalanche operation (EAS), thus additionally improving the device's EAS performance.

On the basis of the structures of the super-junction devices shown in FIGS. 3 to 4, the present invention also provides a method of fabricating a super-junction device, which includes the steps of:

providing a substrate defining a core region, a transition region and a termination region;

forming an epitaxial layer of the first conductivity type on the substrate and a number of pillars of the first conductivity type and a number of pillars of a second conductivity type in the epitaxial layer of the first conductivity type at least in the core and transition regions, which are arranged alternately, wherein upper portions of some of the pillars of the second conductivity type in the core region in proximity to the transition region exhibit a dopant ion concentration profile increasing in the direction from the transition region to the core region, and wherein a width of at least partial thickness of a pillar of the second conductivity type positioned at an interface between the transition region and the core region is less than a width of each pillar of the second conductivity type in the core region.

For a better understanding of the method of fabricating a super-junction device, particular embodiments thereof will be described in detail below with reference to FIGS. 5 to 17.

Figure 5:
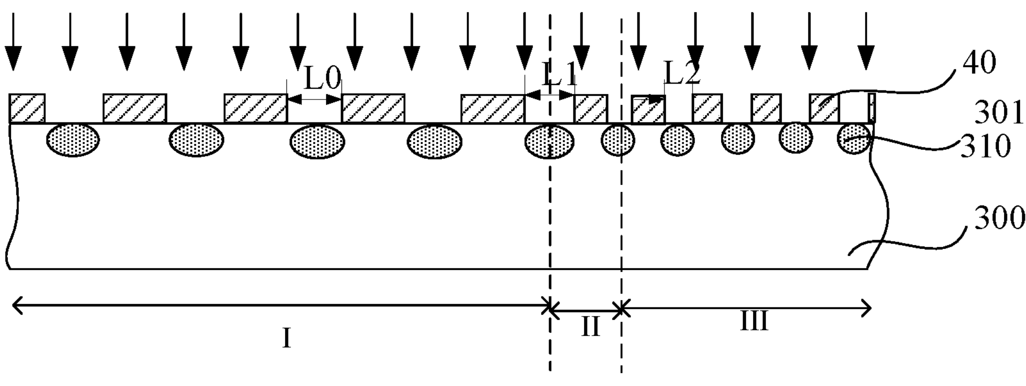
FIGS. 5 to 9 are schematic cross-sectional views illustrating a method of fabricating a super-junction device according to an embodiment of the present invention.
Figures 6, 7:
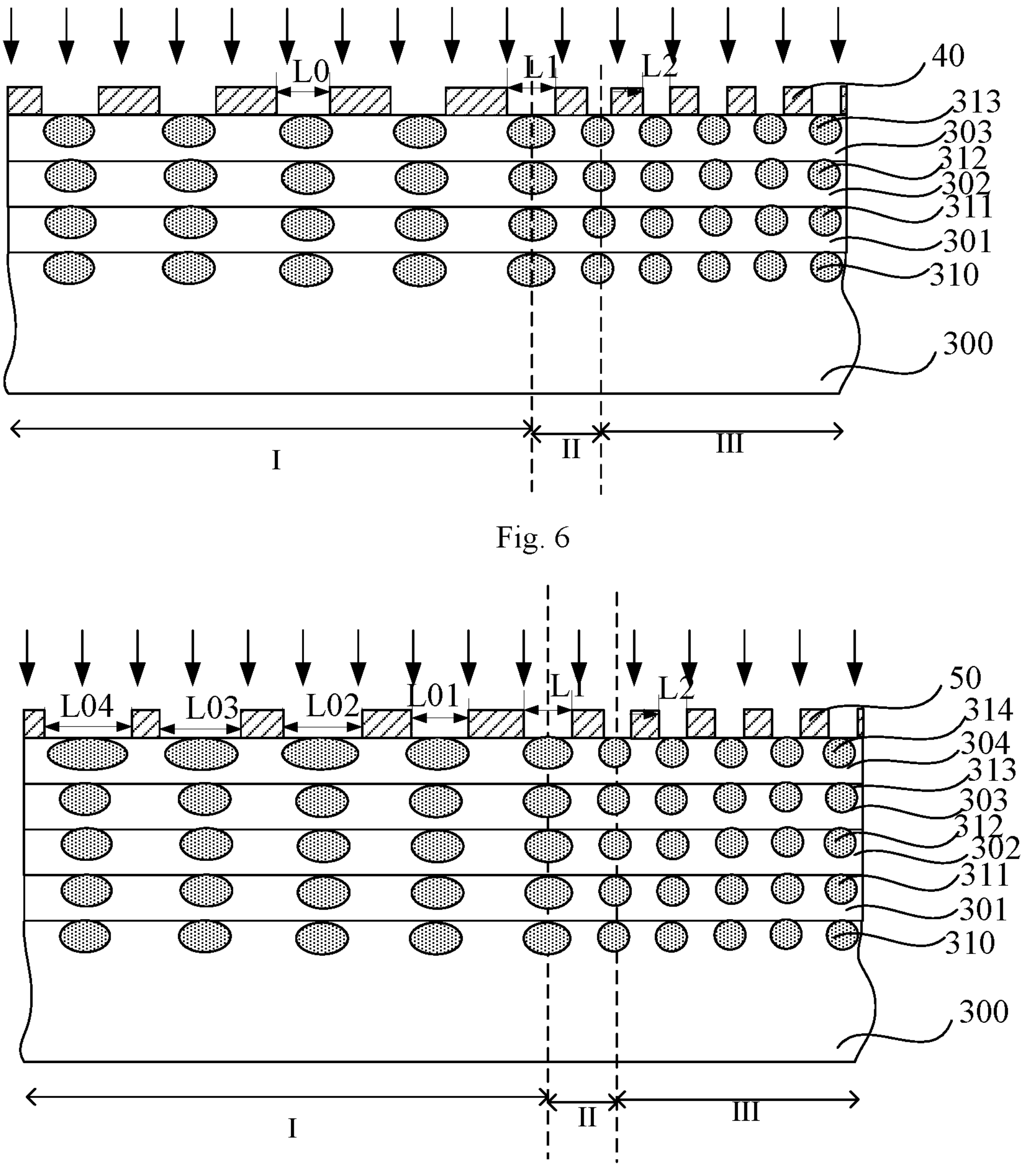

Referring to FIGS. 5 to 9, according to an embodiment of the present invention, the method of fabricating a super-junction device includes the steps of:

S1*a*) as shown in FIG. 5, providing a substrate (not shown) defining a core region I, a transition region II and a termination region III and forming a lower epitaxial layer on the substrate;

S1*b*) performing a first ion implantation process to implant ions of the second conductivity type into regions of the lower epitaxial layer;

S1*c*) repeating steps S1*a* to S1*b* for a required number of times, wherein during the repetitions, the sizes of openings through which the first ion implantation processes are carried out in the transition and core regions are adjusted as required by a desired width profile of a pillar of the second conductivity type to be formed at an interface between the transition region and the core region and by a desired dopant ion concentration profile of upper portions of pillars of the second conductivity type to be formed in the core region;

S1*d*) growing an upper epitaxial layer and performing a second ion implantation process to implant ions of the second conductivity type into regions of the upper epitaxial layer in alignment with some of the regions where the first ion implantation processes are performed;

S1*e*) performing an annealing process so that ions in the regions of the lower epitaxial layers that have received ion implantation in the first ion implantation processes diffuse so that the regions vertically merge to form alternately arranged pillars of the second and first conductivity types and that ions in the regions that have received ion implantation in the second ion implantation process diffuse so that the regions expand to meet tops of the respective pillars of the second conductivity type and thereby form wells of the second conductivity type;

S1*f*) forming a main junction, the bottom of which is in contact with a top of at least one pillar of the second conductivity type in the termination region, by performing a third ion implantation on the upper epitaxial layer in the termination region to implant ions of the second conductivity type into a portion thereof in close proximity to the transition region;

S1*g*) forming a field oxide layer on a surface of the epitaxial layer of the first conductivity type at least in the termination region, which exposes part of a top surface of the main junction;

S1*h*) forming gate oxide layers and polysilicon gates in the core, transition and termination regions;

S1*i*) forming source regions in the wells of the second conductivity type in the core and transition regions so that the source regions are situated on opposing sides of the individual polysilicon gates; and S1*j*) forming a drain region on a backside of the epitaxial layer of the first conductivity type facing away from the polysilicon gates.

Referring to FIG. 5, the substrate (not shown) defining the core region I, the transition region II and the termination region III provided in step S1*a* is, for example, a monocrystalline silicon substrate, and a lowermost epitaxial layer 300 is then formed on the substrate using a deposition technique such as chemical vapor deposition or atomic layer deposition. The lowermost epitaxial layer 300 is a semiconductor layer doped with ions of the first conductivity type (e.g., n-type ions such as germanium and/or arsenic ions). The lowermost epitaxial layer 300 is for example an n-type monocrystalline silicon layer. Photoresist is then coated on the lowermost epitaxial layer 300 and subject to a sequence of photolithography steps including exposure and development so that a first patterned photoresist layer 40 is formed, which has openings for ion implantation for forming the pillars of the second conductivity type, including openings with a width of L0 in the core region I, an opening with a width of L1 at the interface between the transition region II and the core region I, and openings with a width of L2 in the termination region III. L1 is less than L0. For example, L1 may be 3-5% less than L0. Optionally, L2 may be less than L1, which is in turn less than L0 (L2<L1<L0).

With continued reference to FIG. 5, in step S1*b*, with the first patterned photoresist layer 40 serving as a mask, ions of the second conductivity type are normally implanted into a top portion of the lowermost epitaxial layer 300, resulting in the formation of regions 310 implanted with ions of the second conductivity type at the same depth. Ions of the second conductivity type may be of, for example, boron, boron fluoride, phosphorus or a combination thereof. The first patterned photoresist layer 40 is then stripped away.

In step S1*c*, steps S1*a* to S1*b* are repeated for a number of times as required by the device being fabricated. In the present embodiment, the steps are repeated for four times. Specifically, referring to FIG. 6, a first patterned photoresist layer 40 is formed on a new grown lower epitaxial layer using the same photomask as has been used to form the regions 310, and with the new first patterned photoresist layer 40 serving as a mask, ions of the second conductivity type are normally implanted into a top portion of the new lower epitaxial layer, resulting in the formation of further regions 310 implanted with ions of the second conductivity type at the same depth, followed by removal of the first patterned photoresist layer 40. This process is repeated so that lower epitaxial layer 301, 302, 303 of the first conductivity type are successively stacked over the lowermost epitaxial layer 300. The lower epitaxial layers 301, 302, 303 may be of the same thickness and thinner than the lowermost epitaxial layer 300. The lower epitaxial layer 301, 302, 303 are doped with the same concentration of ions of the first conductivity type as the lowermost epitaxial layer 300, and regions 311 implanted with ions of the second conductivity type are formed in the lower epitaxial layer 301 in alignment with the respective regions 310 implanted with ions of the second conductivity type, regions 312 implanted with ions of the second conductivity type in the lower epitaxial layer 302 in alignment with the respective regions 311 implanted with ions of the second conductivity type, and regions 313 implanted with ions of the second conductivity type in the lower epitaxial layer 303 in alignment with the respective regions 312 implanted with ions of the second conductivity type. Subsequently, referring to FIG. 7, another lower epitaxial layer 304 is formed on the lower epitaxial layer 303, and a second patterned photoresist layer 50 is formed on the lower epitaxial layer 304 using a new photomask, which has openings for ion implantation for forming the pillars of the second conductivity type, including the same openings as those in the first patterned photoresist layer 40 at the interface between the transition region II and the core region I and in the termination region III. However, in order to create a dopant ion concentration profile increasing in the direction away from the transition region I across upper portions of the first to i-th pillars of the second conductivity type in the core region I that are in proximity to the transition region II (i.e., the upper portion of the i-th pillar of the second conductivity type has the highest dopant ion concentration) and to maintain the same dopant ion concentration across upper portions of all the other pillars of the second conductivity type as the upper portion of the i-th pillar of the second conductivity type, openings in the second patterned photoresist layer 50 gradually increase their width in the direction from the transition region II to the core region I until a predetermined value is reached and then keep their width invariable. In the example shown in FIG. 7, i=4, so L01<L02<L03<L04 is satisfied, and the widths of the openings in the second patterned photoresist layer 50 corresponding to the (i+1)-th to n-th pillars of the second conductivity type are all equal to L04. In this way, differently-sized openings for ion implantation for forming the pillars of the second conductivity type can be simultaneously in the same photolithography process. After that, with the second patterned photoresist layer 50 serving as a mask, ions of the second conductivity type are implanted into the lower epitaxial layer 304, resulting in the formation of regions 314 implanted with ions of the second conductivity type in the lower epitaxial layer 304 in alignment with the respective regions 313 implanted with ions of the second conductivity type.

Figure 8:
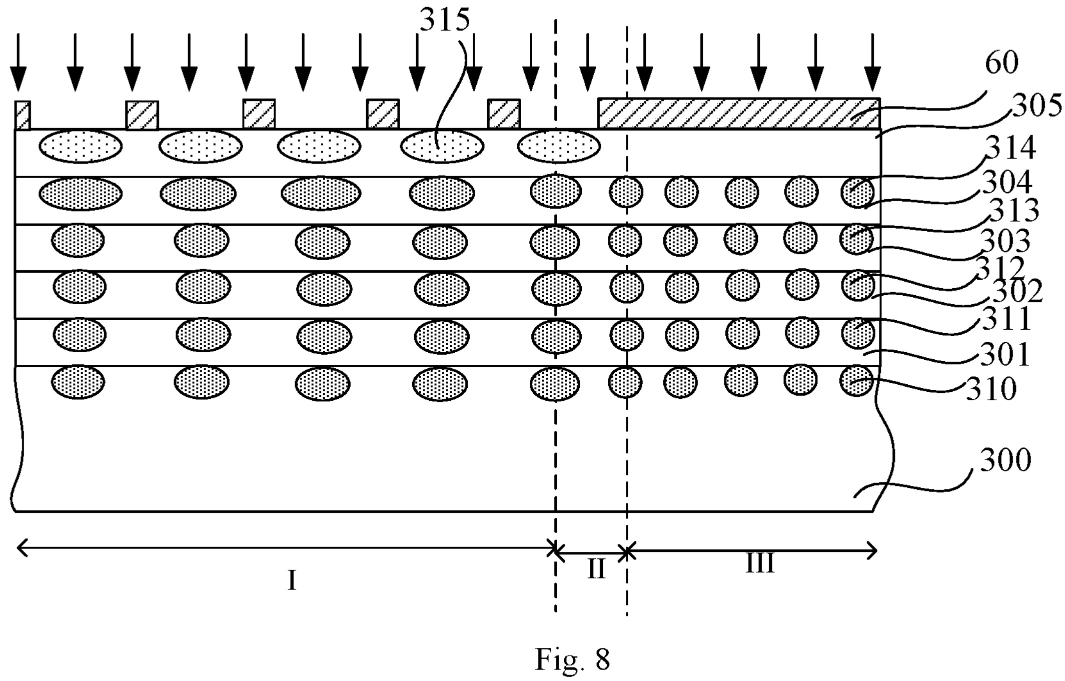

Referring to FIG. 8, in step S1*d*, the upper epitaxial layer 305 is formed on the lower epitaxial layer 304 using a deposition technique such as chemical vapor deposition or atomic layer deposition. The upper epitaxial layer 305 is a semiconductor layer doped with ions of the first conductivity type (e.g., n-type ions such as germanium and/or arsenic ions) and having a thickness thinner than that of the lower epitaxial layer 304. The dopant ion concentration of the upper epitaxial layer 305 may be the same as that of the lower epitaxial layer 304. Photoresist is then coated on the upper epitaxial layer 305 and subject to a sequence of photolithography steps including exposure and development so that a third patterned photoresist layer 60 is formed, which has openings, where upper surface portions of the upper epitaxial layer 305 corresponding to the wells of second conductivity type to be formed in the core region I and the transition region II are exposed, and covers the rest of the upper epitaxial layer 305. Afterwards, with the third patterned photoresist layer 60 serving as a mask, ions of the second conductivity type are normally implanted into a top portion of the upper epitaxial layer 305, resulting in multiple regions 315 implanted with ions of the second conductivity type at the same depth. The dopant ion concentration of the regions 315 may be lower than that of the regions 314. Thereafter, the third patterned photoresist layer 60 is removed.

Figure 9:
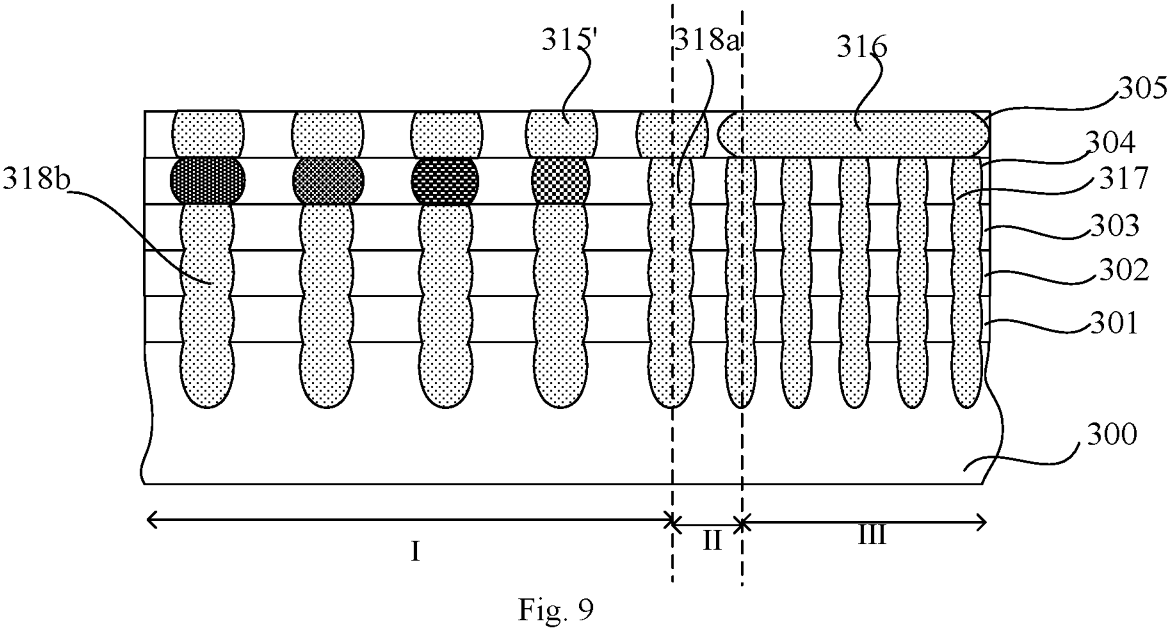

Referring to FIGS. 8 and 9, in step S1*e*, a rapid annealing technique is utilized to anneal the whole structure resulting from the formation of the regions 315 so that the implanted ions of the second conductivity type in the regions 315 and 310 to 314 diffuse both vertically and horizontally. As a result of the vertical diffusion of the implanted ions of the second conductivity type in the regions 310 to 314, the regions 314 expand downward and the regions 313 expand upward and merge into the respective downward expanding regions 314, the regions 313 expand downward and the regions 312 expand upward and merge into the respective downward expanding regions 313, the regions 312 expand downward and the regions 311 expand upward and merge into the respective downward expanding regions 312, and the regions 311 expand downward and the regions 310 expand upward and merge into the respective downward expanding regions 311, resulting in the formation of pillars 318*b* of the second conductivity type and wells 315' of the second conductivity type residing on top of the respective pillars 318*b* in the core region I, a pillar 318*a* of the second conductivity type at the interface between the transition region II and the core region I and a well 315' of the second conductivity type residing on top of the pillar 318*a*, and pillars 317 of the second conductivity type in the termination region III. The lowermost epitaxial layer 300, the lower epitaxial layers 301 to 304 and the upper epitaxial layer 305 are stacked together to make up the aforesaid epitaxial layer of the first conductivity type. Portions of the epitaxial layer of the first conductivity type sandwiched between adjacent pillars of the second conductivity type serve as the aforesaid pillars of the first conductivity type. Thus, the pillars of the first and second conductivity types are alternately arranged in the epitaxial layer of the first conductivity type. Moreover, the upper portions of some of the pillars 308*b* of the second conductivity type in the core region I in proximity to the transition region II exhibit a dopant ion concentration profile increasing in the direction from the transition region II to the core region I. The pillar 308*a* of the second conductivity type at the interface between the transition region II and the core region I has an overall width that is less than a width of each pillar 308*b* of the second conductivity type in the core region I.

Referring to FIG. 9, in step S1*f*, photoresist is coated on the upper epitaxial layer 305 and subject to a sequence of photolithography steps including exposure and development so that a fourth patterned photoresist layer (not shown) is formed, which has an opening, where an upper surface portion of the upper epitaxial layer 305 corresponding to the main junction to be formed is exposed, and covers the rest of the upper epitaxial layer 305. Subsequently, with the fourth patterned photoresist layer as a mask, a third ion implantation process is carried out to normally implant ions of the second conductivity type into a top portion of the upper epitaxial layer 305, followed by annealing the fourth patterned photoresist layer, thereby resulting in the formation of the main junction 316, the bottom of which is in contact with a top of at least one pillar 317 of the second conductivity type in the termination region III.

With combined reference to FIGS. 3 and 9, in step S1*g*, the local field oxide is formed by deposition of silicon oxide, photolithography and etching. The top surface of the main junction 316 in the termination region III is entirely or in part exposed from the local field oxide. In step S1*h*, a gate formation process is performed, in which a gate oxide layer and a polysilicon gate layer are successively formed as a stack, and the gates are then formed through performing photolithography and etching processes on the stack. In step S1*i*, the source regions are formed in the wells of the second conductivity type in the core region I and the transition region II so that the source regions are situated on opposing sides of the individual polysilicon gates. In step S1*j*, the drain region is formed on the backside of the epitaxial layer of the first conductivity type facing away from the polysilicon gates. Steps S1*g* to S1*j* can be accomplished using conventional techniques, so a detailed description thereof is omitted herein.

In the method of this embodiment, the pillars of the first and second conductivity types and the wells of the second conductivity type are formed by repeated cycles of epitaxial layer deposition and ion implantation. Moreover, in comparison to the prior art, the size of the opening for ion implantation for forming the pillar of the second conductivity type in the transition region is finely tuned and the sizes of the openings in the lower epitaxial layer that is closest to the upper epitaxial layer for ion implantation for forming the pillars of the second conductivity type in the core region I are slightly expanded, thus creating a dopant ion concentration profile increasing in the direction from the transition region II to the core region I across upper portions of some of the pillars of the second conductivity type in the core region I in proximity to the transition region II, and making the pillar of the second conductivity type in the transition region II narrower across at least a partial thickness than the pillars of the second conductivity type in the core region I. Therefore, the method involves a simple process that is low in cost and easy to implement.

It is to be noted that, although the main junction and the wells of the second conductivity type have been described in the above embodiment as being formed in two separate ion implantation process, in other embodiments of the present invention, it is also possible that the third patterned photoresist layer 60 shown in FIG. 8 has another opening where a portion corresponding to the main junction to be formed is exposed, thus allowing the main junction and the wells of the second conductivity type to be formed in a single ion implantation process to further simplify the process. In further embodiments of the present invention, the dopant ion concentration profile increasing in the direction from the transition region II to the core region I across the upper portions of the pillars of the second conductivity type may be alternatively formed by successively forming openings using multiple photolithography processes and implanting ions through the openings at different doses to form the pillars of the second conductivity type in the core region.

In other embodiments of the present invention, among the repetitions of steps S1*a* to S1*b* in step S1*c*, for the pillar at the interface between the transition region II and the core region I, smaller sized openings for ion implantation may be formed at least in the last two repetitions. In this way, the resulting pillar of the second conductivity type situated at the interface between the transition region II and the core region I will be narrower in width across at least part of its thickness than the pillars of the second conductivity type in the core region. In a particular example of such embodiments, referring to FIGS. 10 to 14, step S1*c* includes the following sub-steps.

Figures 10, 11, 12:
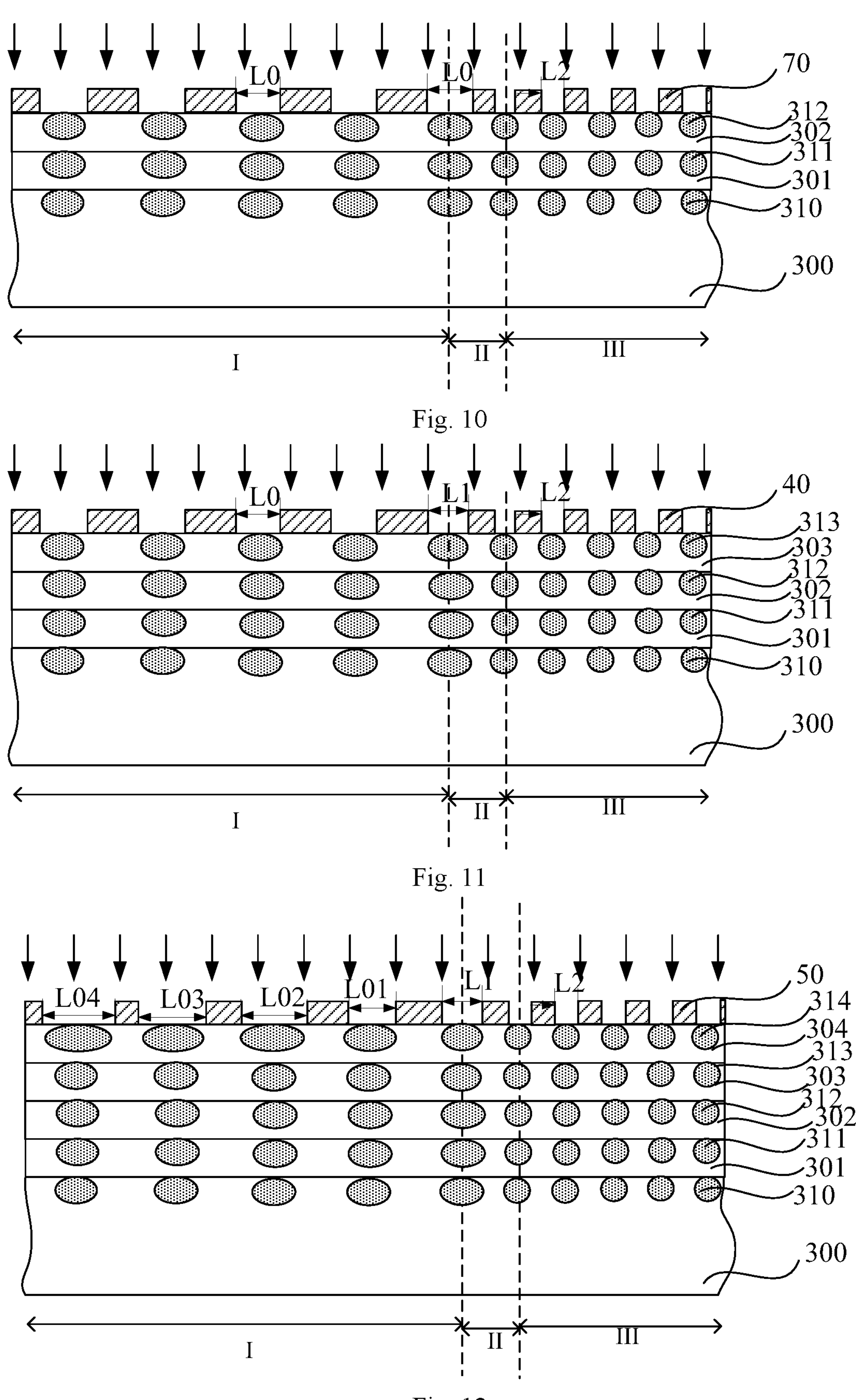
FIGS. 10 to 14 are schematic cross-sectional views illustrating a method of fabricating a super-junction device according to another embodiment of the present invention.
Figure 13:
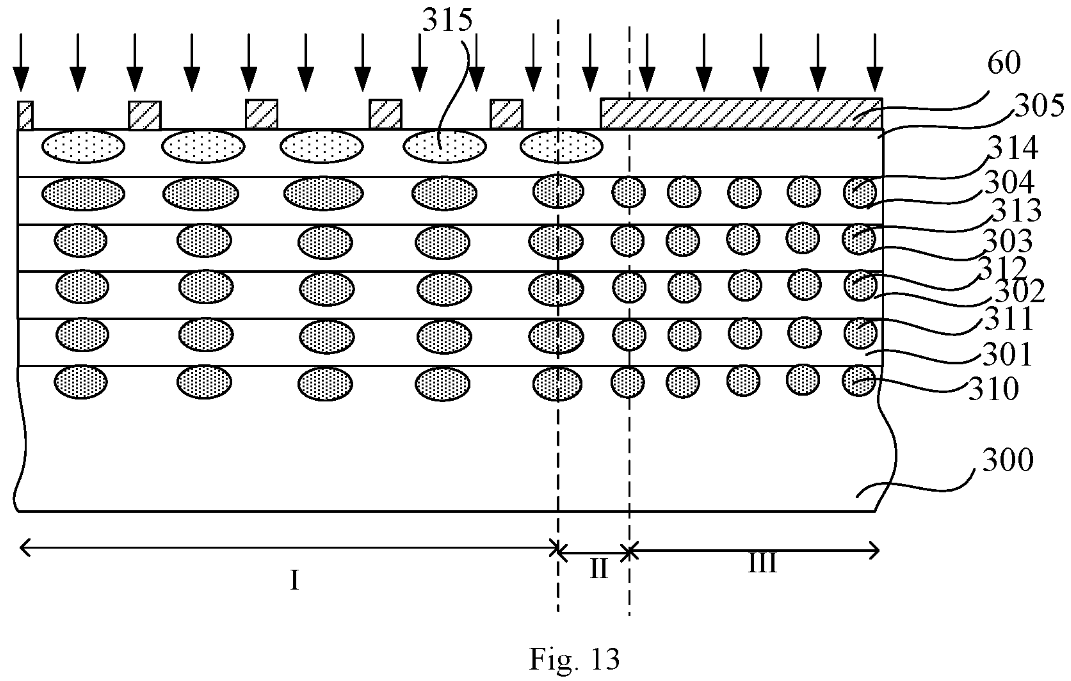
Figure 14:
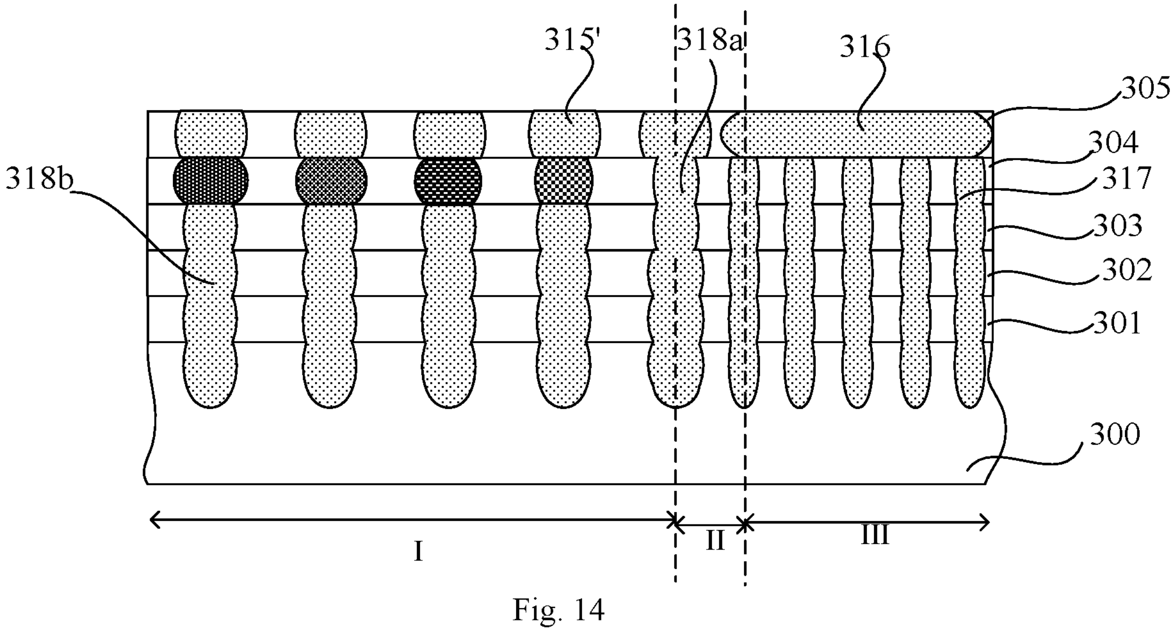

First, referring to FIG. 10, photolithography processes are performed using the same photomask to successively form identical patterned photoresist layers 70, and then corresponding ion implantation processes are performed to form regions 310, 311, 312 implanted with ions of the second conductivity type respectively in the lowermost epitaxial layer 300 and the lower epitaxial layers 301 and 302. Wherein, the patterned photoresist layers 70 have openings of the same size in the core region I and at the interface between the transition region II and the core region I, the openings all have an opening width of L0, and those in the termination region each having an opening width of L2. That is, the patterned photoresist layers 70 are patterned in the same manner in the core region I and the termination region III as the above-described first patterned photoresist layer 40, but the openings in the patterned photoresist layers 70 at the interface between the transition region II and the core region I have a greater opening width than that in the first patterned photoresist layer 40.

Next, referring to FIG. 11, the lower epitaxial layer 303 and the first patterned photoresist layer 40 are successively formed over the lower epitaxial layer 302, and regions 313 implanted with ions of the second conductivity type are formed in the lower epitaxial layer 303 using an ion implantation process, followed by removal of the first patterned photoresist layer 40. Reference can be made to the above description for details in this step, and a further description thereof is omitted here for the sake of brevity.

After that, referring to FIG. 12, the lower epitaxial layer 304 and the second patterned photoresist layer 50 are successively formed over the lower epitaxial layer 303. Widths of openings in the second patterned photoresist layer 50 in the core region I satisfy L01<L02 <L03<L04=L05= . . . =L0*n*, as designated in the direction from the transition region II to the core region I. L05 to L0*n* (not shown) represent the widths of the openings in the second patterned photoresist layer 50 on the left of L04 in the core region I. After regions 314 implanted with ions of the second conductivity type are formed in the lower epitaxial layer 304 using an ion implantation process, the second patterned photoresist layer 50 is removed. Reference can be made to the above description for details in this step, and a further description thereof is omitted here for the sake of brevity.

The subsequent steps are the same as described above, so a further detailed description thereof is omitted. Following the formation of the upper epitaxial layer 305, ion implantation and annealing, the resulting pillars of the first conductivity type, pillars of the second conductivity type and wells of the second conductivity type are shown FIGS. 13 and 14. Upper portions of some of the pillars of the second conductivity type in the core region I in proximity to the transition region II show a dopant ion concentration profile increasing in the direction from the transition region II to the core region I. Moreover, the pillar of the second conductivity type at the interface between the transition region II and the core region I is narrower in width across at least an upper thickness than the pillars of the second conductivity type in the core region I.

It is to be noted that, according to the present invention, the alternately arranged pillars of the first and second conductivity types with a dopant ion concentration profile increasing in the direction from the transition region II to the core region I across upper portions of some of the pillars of the second conductivity type in the core region I in proximity to the transition region II and with a smaller overall width of the pillar of the second conductivity type at the interface between the transition region II and the core region I in comparison to the pillars of the second conductivity type in the core region I may be alternatively formed using an alternative set of processes involving the formation of trenches by etching, filling of the trenches and supplemental ion implantation.

Specifically, according to an embodiment of the present invention, there is provided another method of fabricating a super-junction device, which includes the steps detailed below.

Figure 15:
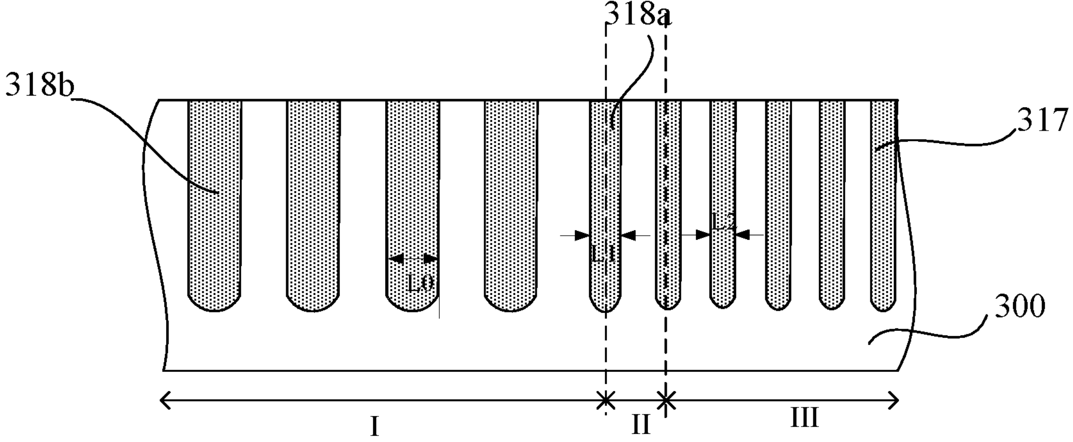
FIGS. 15 to 17 are schematic cross-sectional views illustrating a method of fabricating a super-junction device according to a further embodiment of the present invention.

In S2*a*, a lower epitaxial layer 30 of the first conductivity type is grown over a substrate (not shown) defining a core region I, a transition region II and a termination region III. As shown in FIG. 15, lower epitaxial layer 30 of the first conductivity type may be formed by repeating an epitaxial layer deposition process for multiple times and may have a thickness equal to a total thickness of the lowermost epitaxial layer 300 and the lower epitaxial layers 301 to 304 stacked thereon shown in FIG. 7.

In S2*b*, a number of deep trenches are formed by etching through a partial thickness of the lower epitaxial layer 30. As shown in FIG. 15, the deep trenches include those in the core region I each having a width of L0, one situated at an interface between the transition region II and the core region I having a width of L 1, and those in the termination region III each having a width that may be less than L1.

In S2*c*, an epitaxial layer of the second conductivity type is filled in the deep trenches, thus forming alternately arranged pillars of the second and first conductivity types in the lower epitaxial layer 30. Specifically, referring to FIG. 15, the epitaxial layer may be filled in the deep trenches using an epitaxial layer deposition process and in-situ doped with ions of the second conductivity type while being deposited so that the resulting epitaxial layer is of the second conductivity type. After the filling is completed, a chemical mechanical polishing process may be employed to remove an undesired portion of the epitaxial layer above a top surface of the lower epitaxial layer 30, thus forming pillars 318*b* of the second conductivity type in the individual deep trenches in the core region I, a pillar 318*a* of the second conductivity type in the deep trench situated at the interface between the transition region II and the core region I and pillars of the second conductivity type 317 in the individual deep trenches in the termination region III. Portions of the lower epitaxial layer 30 between adjacent pillars of the second conductivity type provide pillars of the first conductivity type.

Figure 16:
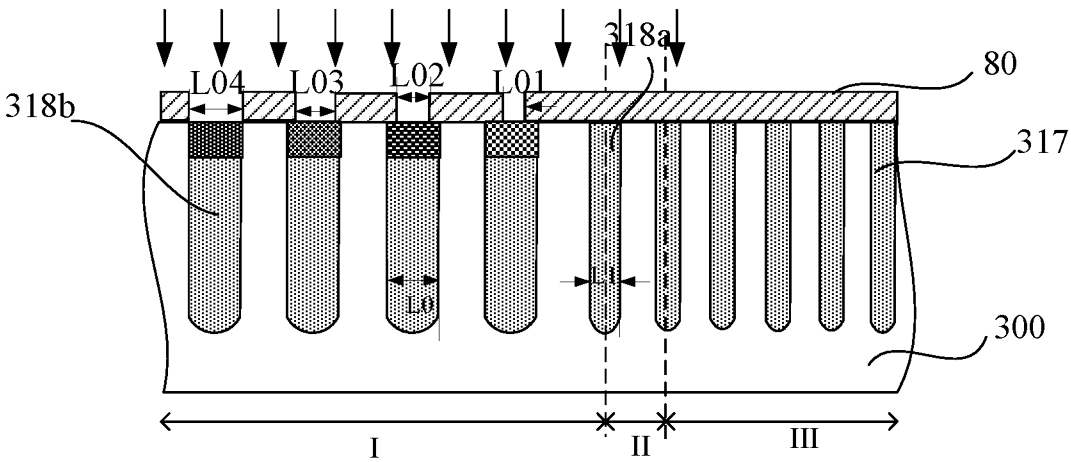

In S2*d*, as required by a desired dopant ion concentration profile of upper portions of the pillars of the second conductivity type in the core region I, ions of the second conductivity type are implanted into the upper portions of a subset of the pillars of the second conductivity type in the core region I in proximity to the transition region II at different doses, thus creating a dopant ion concentration profile increasing in the direction from the transition region II to the core region I across the upper portions of the subset of pillars of second conductivity type in the core region I in proximity to the transition region II, with upper portions of all the other pillars of the second conductivity type in the core region I maintaining the same dopant ion concentration as the one of the subset with the highest dopant ion concentration. As an example, referring to FIG. 16, a patterned photoresist layer 80 may be formed on the lower epitaxial layer 30, which covers both the termination region III and the transition region II and has openings incrementally increasing in size in the direction from the transition region II to the core region I. As shown in FIG. 16, widths of the openings may satisfy L01<L02<L03<L04=L05= . . . =L0*n*, where L05 to L0*n* represent the widths of the openings (not shown) in the patterned photoresist layer 80 on the left of L04 in the core region I. In this way, as a result of one photolithography process and supplemental ion implantation, a dopant ion concentration profile increasing in the direction from the transition region II to the core region I across the upper portions of some of the pillars of the second conductivity type in the core region I in proximity to the transition region II is obtained.

Figure 17:
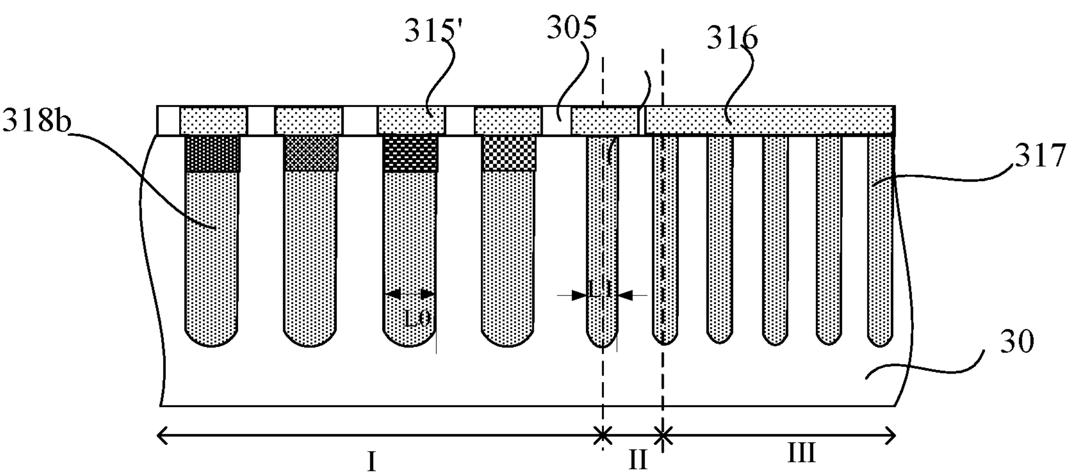

In S2*e*, an upper epitaxial layer 305 is grown on the lower epitaxial layer 30, and the two together make up the aforesaid epitaxial layer of the first conductivity type. Reference can be made to FIG. 17 in this regard.

In S2*f*, wells 315' of the second conductivity type joined to tops of the respective pillars 308*a*, 308*b* of the second conductivity type and a main junction 316 joined to multiple pillars 317 of the second conductivity type in the termination region III are formed in the upper epitaxial layer 305 through forming shallow trenches in the upper epitaxial layer 305 and then filling them with an epitaxial layer of the second conductivity type, or through implanting ions of the second conductivity type into the upper epitaxial layer 305.

In this embodiment, a local field oxide, gate oxide layers, polysilicon gates, source regions and a drain region may be formed subsequent to the completion of step S2*f*, thus completing the super-junction device. Reference can be made to the above description for details in this regard, and a further description thereof is omitted here for the sake of brevity.

According to the method of this embodiment, pillars of the second conductivity type can be formed simply by etching a sufficient thick lower epitaxial layer of the first conductivity type to form therein trenches and then filling the trenches with an epitaxial layer of the second conductivity type, dispensing with the need for multiple ion implantation processes and thus entailing an even simpler process.

It is to be noted that, although it has been described in the above embodiment that an increasing dopant ion concentration profile is created across upper portions of some pillars of the second conductivity type in the core region I through forming openings sized to be incrementally increase in the core region in step S2*d*, the present invention is not limited thereto, as in other embodiments of the present invention, it is also possible to create such an increasing dopant ion concentration profile across the upper portions of the pillars of the second conductivity type in the core region I using any other proper process. For example, the part of the pillars of the second conductivity type in the core region I below the upper portions may be formed in steps S2*a* to S2*c*, and the upper portions may be then formed in step S1*c* by means of epitaxy and ion implantation in such a manner that some of these upper portions exhibit a dopant ion concentration profile increasing in the direction from the transition region to the core region. As another example, the entire pillars of the second conductivity type may be formed in steps S2*a* to S2*c*, and an etch-back process may be then formed to remove upper portions of the pillars of the second conductivity type and of the surrounding pillars of the first conductivity type in the core region, leaving openings of different sizes. New upper portions of the pillars of the second conductivity type may be then epitaxially grown in the individual openings. The new upper portions of the pillars of the second conductivity type may have widths incrementally increasing in the direction from the transition region to the core region, which can create a dopant ion concentration profile increasing in the same direction across the upper portions of some of the pillars of the second conductivity type in the core region I.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:

1. A super-junction device comprising an epitaxial layer of a first conductivity type, the epitaxial layer defining a core region, a termination region surrounding the core region and a transition region interposed between the core region and the termination region, the epitaxial layer containing a number of pillars of the first conductivity type and a number of pillars of a second conductivity type in the core and transition regions, which are arranged alternately, wherein upper portions of some of the pillars of the second conductivity type in the core region in proximity to the transition region exhibit a dopant ion concentration profile increasing from the transition region to the core region in a direction parallel to a surface of the epitaxial layer, and wherein a width at least at the upper portion of a pillar of the second conductivity type positioned at an interface between the transition region and the core region is less than a width of the pillar of the second conductivity type in the core region, wherein a dopant ion concentration of the upper portion of each pillar of the second conductivity type in the core region is higher than that of any other non-upper portion of all pillars of the second conductivity type in the core region, and the dopant ion concentration of the upper portion of each pillar of the second conductivity type in the core region is higher than a dopant ion concentration of any portion of the pillar of the second conductivity type at the interface between the transition region and the core region, wherein the epitaxial layer of the first conductivity type is a stack of multiple epitaxial layers, and wherein the width of the portion of the pillar of the second conductivity type at the interface between the transition region and the core region provided by the topmost two of the multiple epitaxial layers is 7-14% less than the width of the pillars of the second conductivity type in the core region, wherein the upper portion of the pillar at the interface between the transition region and the core region has a reduced width, while the remainder of the pillar has a width equal to the width of the pillar of the second conductivity type in the core region.

2. The super-junction device of claim 1, wherein a portion of the pillar of the second conductivity type at the interface between the transition region and the core region provided by the topmost two of the multiple epitaxial layers is narrower in width than the pillars of the second conductivity type in the core region.

3. The super-junction device of claim 1, wherein the pillars of the second conductivity type in the core region are numbered from 1 to n in the direction from the transition region to the core region, in which the upper portions of the pillars of the second conductivity type numbered from 1 to i exhibit the increasing dopant ion concentration profile, and the dopant ion concentrations of the upper portions of the pillars of the second conductivity type numbered from i to n are equal, where n is a natural number greater than 1 and $1<i<n$.

4. The super-junction device of claim 1, further comprising:

wells of the second conductivity type residing on top of the pillars of the second conductivity type in the core and transition regions;

gates provided on the epitaxial layer of the first conductivity type in the core region;

source regions provided in the wells of the second conductivity type on opposing sides of the gates; and a drain region formed on a backside of the epitaxial layer of the first conductivity type.

5. The super-junction device of claim 1, further comprising:

a number of pillars of the first conductivity type and a number of pillars of the second conductivity type, which are arranged alternately in the epitaxial layer of the first conductivity type in the termination region; and a main junction residing on top of at least one of the pillars of the second conductivity type in the termination region in proximity to the transition region.

* * * * *